(12) United States Patent
Kajiyama

(10) Patent No.: US 7,061,032 B2
(45) Date of Patent: Jun. 13, 2006

(54) SEMICONDUCTOR DEVICE WITH UPPER PORTION OF PLUGS CONTACTING SOURCE AND DRAIN REGIONS BEING A FIRST SELF-ALIGNED SILICIDE

(75) Inventor: Takeshi Kajiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/787,133

(22) Filed: Feb. 27, 2004

(65) Prior Publication Data
US 2004/0227189 A1 Nov. 18, 2004

(30) Foreign Application Priority Data
Feb. 28, 2003 (JP) .............................. 2003-054278

(51) Int. Cl.
*H01L 29/772* (2006.01)
(52) U.S. Cl. .................................... 257/288
(58) Field of Classification Search ................ 257/349, 257/350, 351, 336, 344, 288; 438/152, 153
See application file for complete search history.

(56) References Cited

U.S. PATENT DOCUMENTS

| | | | | |
|---|---|---|---|---|
| 5,475,240 A | * | 12/1995 | Sakamoto | ..................... 257/67 |
| 5,567,962 A | | 10/1996 | Miyawaki et al. | .......... 257/296 |
| 6,087,706 A | * | 7/2000 | Dawson et al. | ............. 257/520 |
| 6,096,644 A | * | 8/2000 | Lukanc | ....................... 438/674 |
| 6,114,209 A | * | 9/2000 | Chu et al. | .................... 438/300 |
| 6,436,770 B1 | * | 8/2002 | Leung et al. | ................ 438/268 |
| 6,461,959 B1 | * | 10/2002 | Chien et al. | ................. 438/672 |
| 6,632,723 B1 | | 10/2003 | Watanabe et al. | ........... 438/421 |
| 6,873,539 B1 | * | 3/2005 | Fazan et al. | ................. 365/149 |

OTHER PUBLICATIONS

Kedzierski et al., Design analysis of thin-boby silicide source/drain devices, 2001 IEEE International SOI conference, pp. 21-22.*

Inoh et al., FBC (Floating Body Cell) for Embedded DRAM on SOI, 2003 Symposium on VLSI Technology Digest of technical Papers, pp. 63-64.*

* cited by examiner

*Primary Examiner*—Evan Pert
(74) *Attorney, Agent, or Firm*—Oblon, Spivak, McClelland, Maier & Neustadt, P.C.

(57) ABSTRACT

A semiconductor device including: a cell transistor including: a pair of source and drain regions formed in a surface portion of a silicon substrate so as to have a predetermined space therebetween; a channel region sandwiched by the source and drain regions; a gate formed above the channel region with a gate dielectric film being formed therebetween; and a silicon plug formed on the silicon substrate, the silicon plug electrically contacting the source and drain regions, an upper portion of the silicon plug being a first self-aligned silicide portion.

19 Claims, 7 Drawing Sheets

(FBC CELL PORTION)

(FBC PERIPHERY CIRCUIT PORTION)

(FBC CELL PORTION)

(FBC PERIPHERY CIRCUIT PORTION)

(CELL PORTION)

(PERIPHERY CIRCUIT PORTION)

(CELL PORTION)

(PERIPHERY CIRCUIT PORTION)

(CELL PORTION)

(PERIPHERY CIRCUIT PORTION)

(CELL PORTION)

(PERIPHERY CIRCUIT PORTION)

(PLAN VIEW OF FBC MEMORY)

(SECTIONAL VIEW OF FBC MEMORY)

(FBC CELL PORTION)

(FBC PERIPHERY CIRCUIT PORTION)

US 7,061,032 B2

SEMICONDUCTOR DEVICE WITH UPPER PORTION OF PLUGS CONTACTING SOURCE AND DRAIN REGIONS BEING A FIRST SELF-ALIGNED SILICIDE

CROSS-REFERENCE TO RELATED APPLICATION

This application is based upon and claims the benefit of priority from prior Japanese Patent Application No. 2003-54278, filed on Feb. 28, 2003, the entire contents of which are incorporated herein by reference.

BACKGROUND OF THE INVENTION

1. Field of the Invention

The present invention relates to semiconductor devices. In particular, the present invention relates to a semiconductor device including a semiconductor memory, in which a PN junction is formed at a charge-storage boundary, the semiconductor memory having a lower wiring resistance while preventing a junction leakage current.

2. Background Art

Recently, semiconductor memories having a charge-storage region in a cell have been studied in order to achieve high-integration.

An FBC (Floating-Body Cell) memory is known as such a semiconductor device, which was introduced during a lecture given in the ISSCC 2002 (International Solid-State Circuit Conference 2002, held in San Francisco, Mar. 3–7, 2002). The details of this memory were clarified in "ISSCC 2002/SESSION 9/DRAM AND FERROELCTRIC MEMORIES/9.1/Memory Design Using One-Transistor Gain Cell SOI/Takashi Ohasawa et al.".

The FBC memory has a cell structure including an MOS transistor formed on an SOI (Silicon On Insulator), a charge-storage region for storing charge being formed under the transistor.

In such an FBC memory, especially one having a PN junction at the boundary of a charge-storage region, there is a case where a polycrystalline silicon plug is used as a plug or wiring on the PN junction in order to decrease a junction leakage current. However, with a polycrystalline silicon plug, it is difficult to achieve a lower wiring resistance.

FIG. 11 is a plan view of an FBC memory, which is an example of a semiconductor device known to the present inventor, and FIG. 12 is a sectional view taken along line A—A of FIG. 11.

In these drawings, "UC" denotes a unit cell constituting a MOS transistor. As shown in FIG. 12, the SOI structure of the FBC memory includes a support substrate 1 formed of p-type silicon, an embedded oxide layer (insulating layer) 2 formed on the support substrate 1 with an n-type well 1a provided therebetween, and a silicon layer 3 formed on the embedded oxide layer 2. The silicon layer 3 includes source and drain regions (diffusion layer regions) 4, 4, and a channel region 5 sandwiched by the source and drain regions 4, 4. A source line SL or a bit line BL is formed above the diffusion layer regions 4, 4, and a word line (gate) WL is formed above the channel region 5 with a gate insulating layer 7 located therebetween. The diffusion layer 4 (D=drain) and the bit line BL are connected by a contact plug CP. The contact plug CP and the source line SL are formed of polycrystalline silicon. The source line SL is grounded. In these drawings, "8" denotes an interlayer dielectric film (BPSG).

In the FBC memory having the aforementioned structure, when a current flows from the diffusion layer region 4 (D) to the diffusion layer region 4 (S=source) via the channel region 5, hot holes are generated within the channel region 5. The hot holes are stored in the channel region 5. That is to say, the channel region 5 serves as a data (hole) storage capacitor, i.e., charge-storage region, to perform a memory operation. Thus, the charge-storage region is located under the gate (word line WL) of the unit cell UC, i.e., a MOS transistor. The FBC memory has an advantageous effect that the circuit area can be considerably decreased, thereby achieving high-integration.

However, the data storage time of an FBC memory is shorter than that of a conventional DRAM. One way of extending the data storage time may be to decrease a junction leakage current flowing through the diffusion layer regions 4. At the same time, since it is necessary to generate hot holes in the charge-storage region, it would be better if the resistance of the bit line BL and the source line SL connected to the ground were lower. FIGS. 13 and 14 show an example of an FBC memory in which a source line SL and a contact plug CP connecting to a bit line BL, which are formed of polycrystalline silicon, are connected via a self-aligned silicide, thereby achieving a lower wiring resistance. FIGS. 13 and 14 are sectional views showing different portions of a single semiconductor device. In particular, FIG. 13 shows an FBC cell portion of, and FIG. 14 shows an FBC periphery circuit portion. As shown in these drawings, a lower wiring resistance is achieved by applying a self-aligned silicide process to an electrode formed of polycrystalline silicon so as to form self-aligned silicide portions 11 at the contact portions and the electrical connection portions of a bit line BL, a word line WL, and a source line SL. In these drawings, "12", "13", and "14" denote gate sidewalls.

As is apparent from FIG. 13, however, with the aforementioned structure, the surface of a (monocrystal) silicon layer 3 is directly subjected to the self-aligned silicide process. Accordingly, an interface reaction occurs or a crystal defect is generated at the junction portion, resulting in a high junction leakage current. As a result, a problem arises in the charge storage capacity, which is important to the memory operation.

Since the conventional semiconductor device known to the present inventor has the aforementioned structure, an attempt to decrease the wiring resistance in order to increase the hot hole storage capacity in the chare-storage region results in the increase in junction leakage current, thereby degrading the charge storage capacity.

SUMMARY OF THE INVENTION

Accordingly, it is an object of the present invention to solve the aforementioned problem of the conventional techniques, and to provide a semiconductor device capable of simultaneously decreasing the wiring resistance and increasing the charge-storage capacity.

In order to achieve the aforementioned object, according to an embodiment of the present invention, a semiconductor device is proposed, the semiconductor device including: a cell transistor including: a pair of source and drain regions formed in a surface portion of a silicon substrate so as to have a predetermined space therebetween; a channel region sandwiched by the source and drain regions; a gate formed above the channel region with a gate dielectric film being formed therebetween; and silicon plugs formed on the silicon substrate, the silicon plugs electrically contacting the source and drain regions, an upper portion of the silicon plug being a first self-aligned silicide portion.

Furthermore, in order to achieve the aforementioned object, according to another embodiment of the present invention, a method of manufacturing a semiconductor device is proposed, the method including: forming a pair of source and drain regions on a silicon substrate with a predetermined space being held therebetween; forming a gate on a channel region sandwiched by the source and drain regions with a gate dielectric film provided between the channel region and the gate; and changing an upper portion of the silicon plugs thus formed to a self-aligned silicide.

DESCRIPTION OF THE EMBODIMENTS

Hereinafter, embodiments of the present invention will be described with reference to the accompanying drawings.

(First Embodiment)

Figure 1:
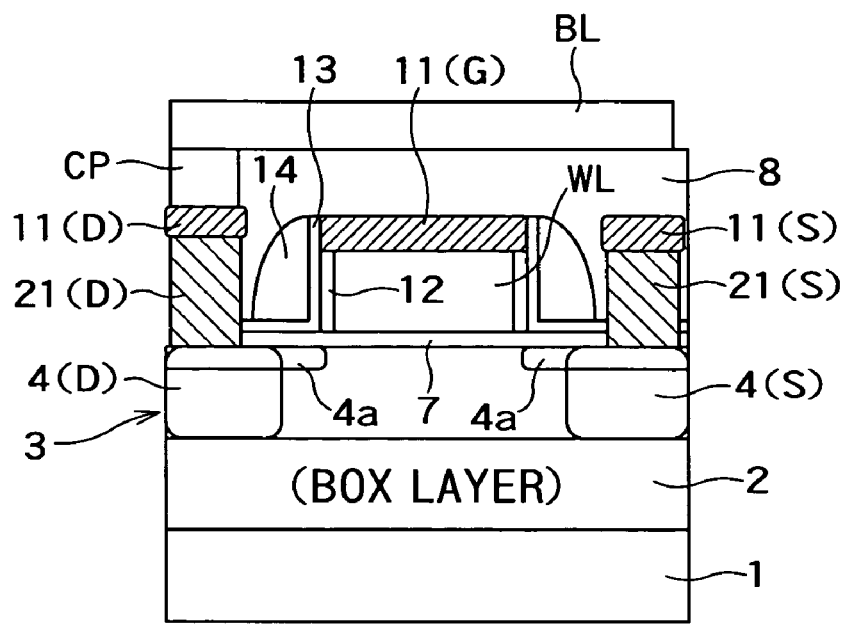
FIG. 1 is a sectional view of a cell portion of a semiconductor device according to the first embodiment of the present invention.
Figure 2:
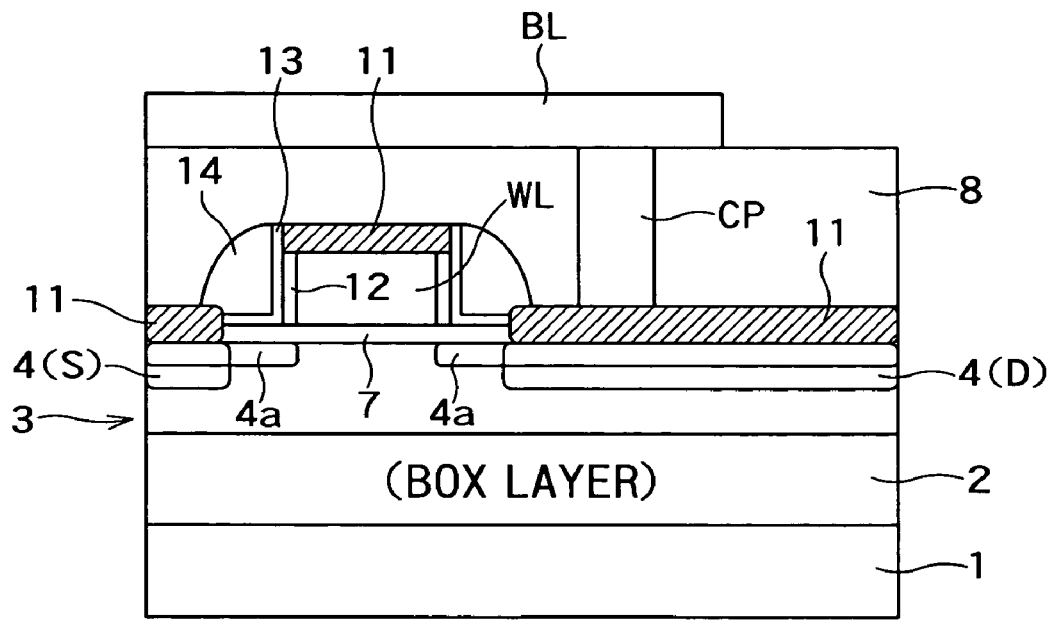
FIG. 2 is a sectional view of a cell periphery portion of the semiconductor device according to the first embodiment of the present invention.

FIGS. 1 and 2 are sectional views of a semiconductor device according to the first embodiment of the present invention. FIG. 1 is a sectional view of an FBC memory cell portion, and FIG. 2 is a sectional view of an FBC memory periphery circuit portion. That is to say, FIGS. 1 and 2 show different portions of a single semiconductor device.

Figure 13:
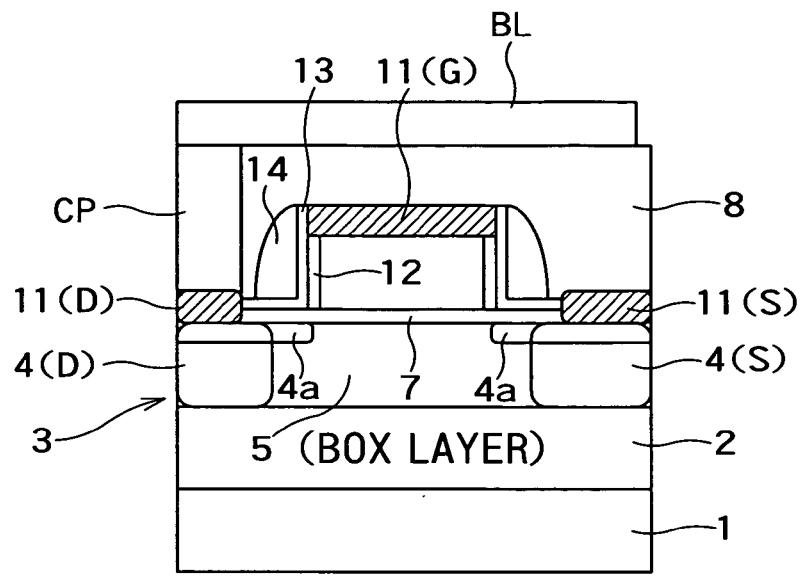
FIG. 13 is a sectional view of a cell portion of another example of a semiconductor device known to the present inventor.
Figure 14:
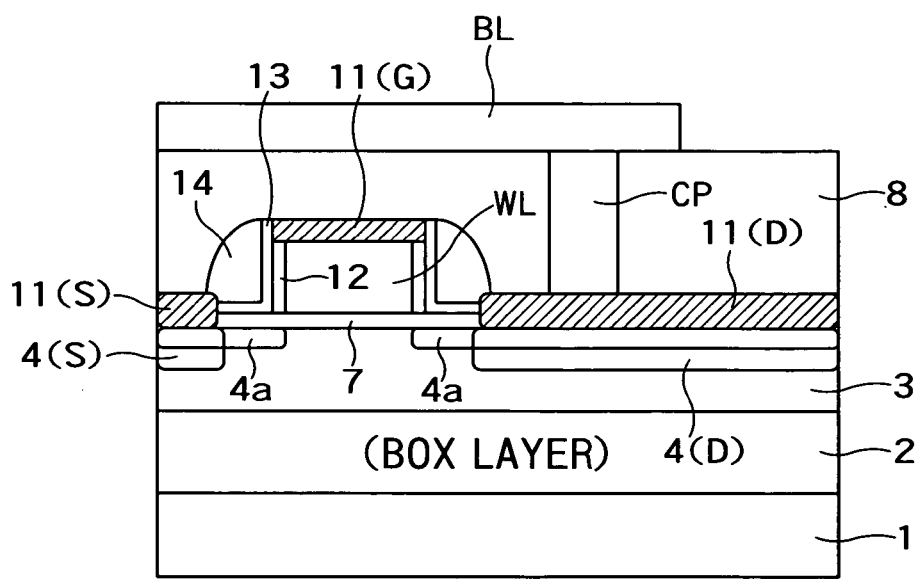
FIG. 14 is a sectional view of a cell periphery portion of another example of a semiconductor device known to the present inventor.

FIG. 2 shows the same structure as that in FIG. 14. That is to say, in the FBC memory periphery circuit portion of FIG. 2, the upper portion of the gate (word line WL), and the upper portions of the diffusion layer regions 4(D=drain) and 4(S=source) serving as the drain and source regions, connecting to the bit line BL and the source line SL, respectively, are self-aligned silicide portions 11, 11, 11, as in the case of a conventional logic LSI. However, the structure shown in FIG. 1 is different from that shown in FIG. 13. That is to say, in the FBC memory cell portion, the upper portion of the word line WL is a self-aligned silicide portion 11, but the upper portions of the diffusion layer regions 4(D) and 4(S) (the bit line BL contact portion and the source line SL contact portion) are not self-aligned silicide portions. Instead, polycrystalline silicon plugs 21(D), 21(S), which are employed in a DRAM or the like, are formed on the diffusion layer regions 4(D), 4(S), and self-aligned silicide portions 21(D), 21(S) are formed at the upper portions thereof. In these drawings, "4a" denotes a so-called LDD portion, in which an impurity concentration is lower as compared with the other portions in the diffusion layer regions 4.

With the aforementioned structure, the word line WL, the bit line BL, and the source line SL are adjusted to have a lower resistance. In addition, since the surface of the diffusion layer regions 4 (silicon layer 3) is not changed to a self-aligned silicide, it is possible to prevent the occurrences of interface reactions and crystal defects at the junction portions, thereby preventing the increase in junction leakage current.

As described above, according to the semiconductor device of the first embodiment, it is possible to form wiring having a lower resistance and a stable charge-storage portion, thereby improving the performance of the semiconductor memory.

(Second Embodiment)

Figure 3:
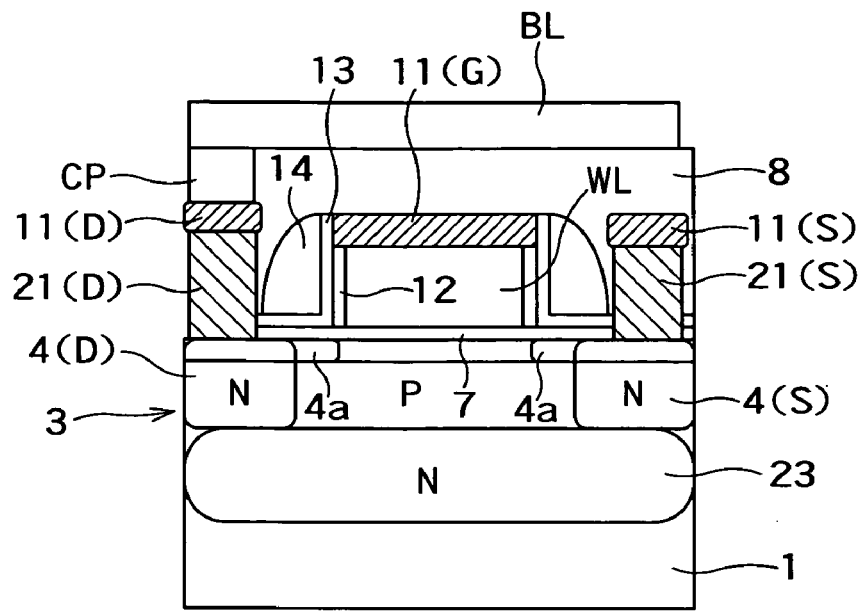
FIG. 3 is a sectional view of a cell portion of a semiconductor device according to the second embodiment of the present invention.
Figure 4:
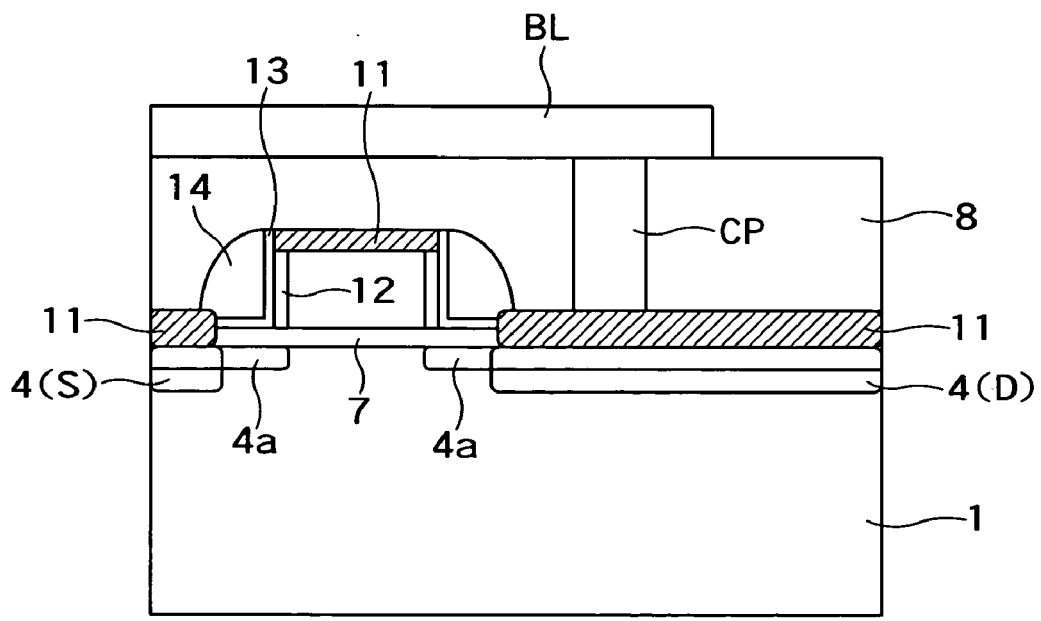
FIG. 4 is a sectional view of a cell periphery portion of the semiconductor device according to the second embodiment of the present invention.

FIGS. 3 and 4 are sectional views of a semiconductor device according to the second embodiment of the present invention, which is a semiconductor memory using a bulk silicon substrate instead of a substrate having an SOI structure. FIG. 3 is a sectional view of a memory cell portion, and FIG. 4 is a sectional view of a memory periphery circuit portion. In this embodiment, a charge-storage layer is surrounded by PN junctions, as can be understood from FIG. 3.

As shown in FIG. 3, in the cell portion of the semiconductor device according to this embodiment, an n-type region 23 is embedded in a silicon layer 3, and a region surrounded by the n-type region 23 and diffusion layer regions 4, 4 serves as a charge-storage region, so as to have a capacitance below the cell.

Furthermore, as shown in FIG. 4, the memory periphery circuit portion of this embodiment has the same structure as that of the first embodiment shown in FIG. 2.

With the aforementioned structure, the word line WL, the bit line BL, and the source line SL are adjusted to have a lower resistance. In addition, since the surface of the diffusion layer regions 4, i.e., the surface of the silicon layer 3, is not changed to a self-aligned silicide, it is possible to prevent the occurrences of interface reactions and crystal defects at the junction portions, thereby preventing the increase in junction leakage current.

As described above, according to the semiconductor device of the second embodiment, it is possible to form wiring having a lower resistance and a stable charge-storage portion, thereby improving the performance of the semiconductor memory, as in the case of the first embodiment.

(Third Embodiment)

Figure 5:
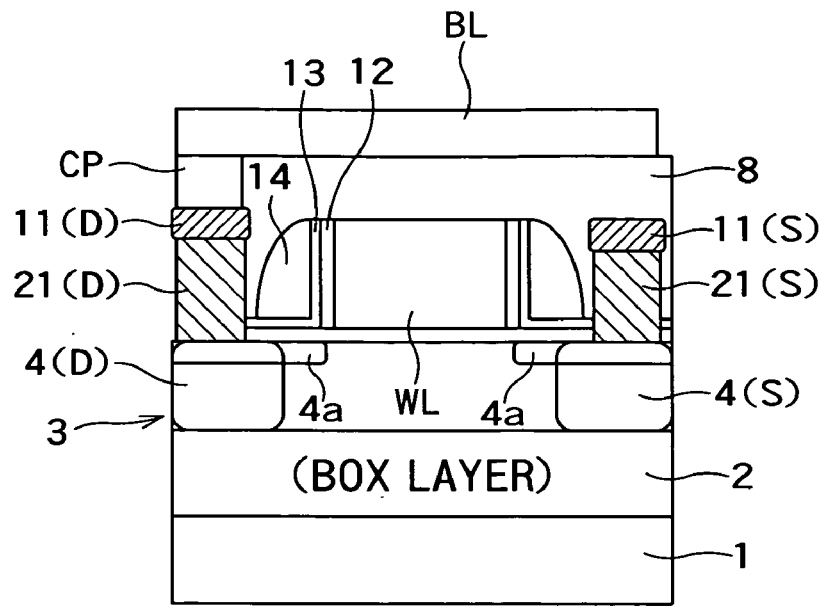
FIG. 5 is a sectional view of a cell portion of a semiconductor device according to the third embodiment of the present invention.
Figure 6:
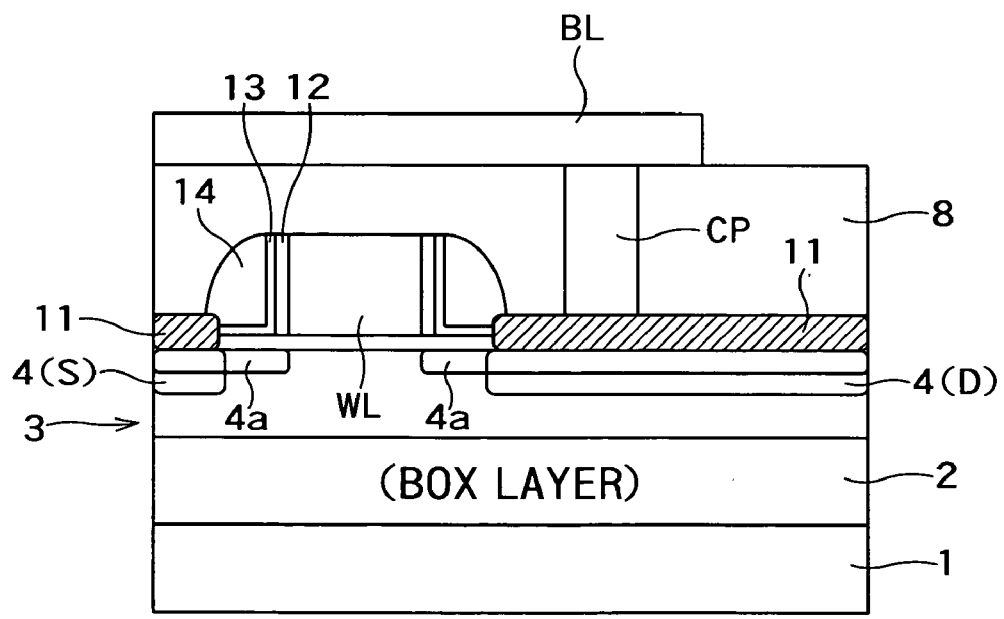
FIG. 6 is a sectional view of a cell periphery portion of the semiconductor device according to the third embodiment of the present invention.

FIGS. 5 and 6 are sectional views of a semiconductor device according to the third embodiment of the present invention. FIG. 5 is a sectional view of an FBC memory cell portion, and FIG. 6 is a sectional view of an FBC memory periphery circuit portion. Part of the third embodiment is the same as the corresponding part of the first embodiment. Accordingly, the third embodiment will be described below also with reference to FIGS. 1 and 2. As can be understood from FIGS. 5 and 6, unlike the first embodiment shown in FIGS. 1 and 2, the upper portion of a word line (gate) WL of the third embodiment is not a self-aligned silicide, but remained to be the original state as in the case of a conventional DRAM. The other portions of the third embodiment shown in FIGS. 5 and 6 are the same as those of the first embodiment shown in FIGS. 1 and 2.

With the aforementioned structure, the bit line BL and the source line SL are adjusted to have a lower resistance. Furthermore, in this case, the surface of the diffusion layer regions 4 is not a self-aligned silicide. Accordingly, it is possible to prevent the occurrences of interface reactions and crystal defects at the junction portions, thereby preventing the increase in junction leakage current. Moreover, since the upper portion of the gate is not a self-aligned silicide, the formation of a self-aligned contact at the cell portion becomes possible.

As described above, according to the semiconductor device of the third embodiment, it is possible to form lower-resistance wiring and a stable charge storage portion. As a result, it is possible to improve the performance of the semiconductor memory, and to improve the productivity due to the formation of a self-aligned contact.

(Fourth Embodiment)

Figure 7:
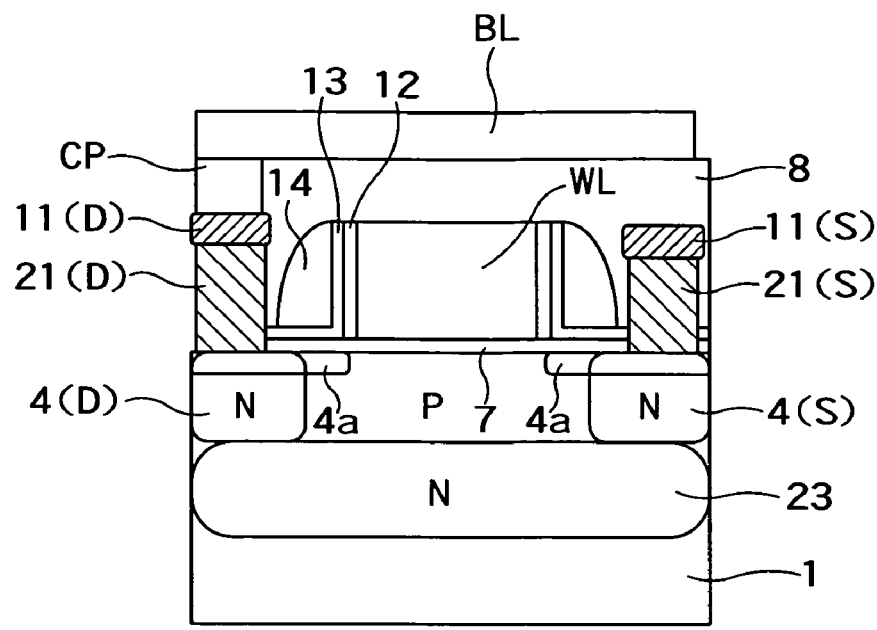
FIG. 7 is a sectional view of a cell portion of a semiconductor device according to the fourth embodiment of the present invention.
Figure 8:
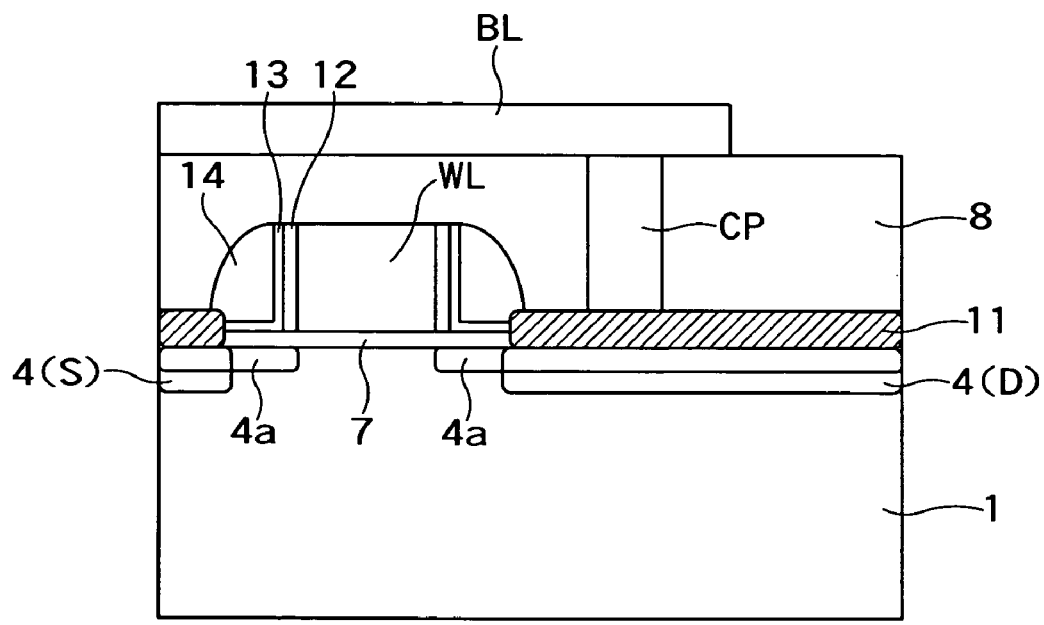
FIG. 8 is a sectional view of a cell periphery portion of the semiconductor device according to the fourth embodiment of the present invention.

FIGS. 7 and 8 are sectional views of a semiconductor device according to the fourth embodiment of the present invention, in which a bulk silicon substrate is used instead of an SOI substrate. FIG. 7 is a sectional view of a memory cell portion, and FIG. 8 is a sectional view of a memory periphery portion.

As shown in FIG. 7, in the semiconductor device of this embodiment, an n-type region 23 is embedded in a support substrate 1, and a region surrounded by the n-type region 23 and diffusion layer regions 4, 4 serves as a charge-storage region, so as to have a capacitance below the cell.

As shown in FIG. 8, in the memory periphery circuit portion, the upper portions of the diffusion layer regions 4, 4 relating to the bit line BL and the source line SL become self-aligned silicide portions 11, as in the case of a conventional logic LSI. However, the upper portion of the gate (word line WL) does not become a self-aligned silicide. On the other hand, as shown in FIG. 7, in the memory cell portion, neither the upper portion of the word line WL nor the upper portions of the diffusion layer regions 4, 4 (bit line BL contact portion and source line SL contact portion) become self-aligned silicide portions. Instead, polycrystalline silicon plugs 7, 7, which are employed in DRAMs, etc., are formed on the diffusion layer regions 4, 4, and the upper portions thereof are changed to self-aligned silicide portions 11.

With the aforementioned structure, the bit line BL and the source line SL are adjusted to have a lower resistance. At the same time, in this case, the upper portions of the diffusion layer regions 4 are not changed to a self-aligned silicide. Accordingly, it is possible to prevent the occurrences of interface reactions and crystal defects at the junction portions, thereby preventing the increase in junction leakage current. Moreover, since the upper portion of the gate is not a self-aligned silicide, the formation of a self-aligned contact at the cell portion becomes possible.

As described above, according to the semiconductor device of the fourth embodiment, it is possible to form lower-resistance wiring and a stable charge-storage portion. As a result, it is possible to improve the performance of the semiconductor memory, and to improve the productivity due to the formation of a self-aligned contact.

(Fifth Embodiment)

Figure 9:
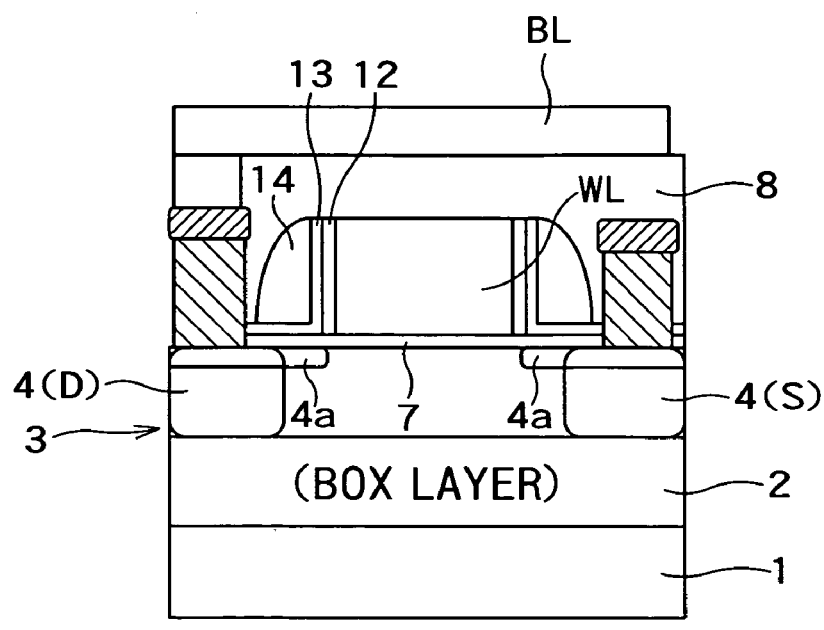
FIG. 9 is a sectional view of a cell portion of a semiconductor device according to the fifth embodiment of the present invention.
Figure 10:
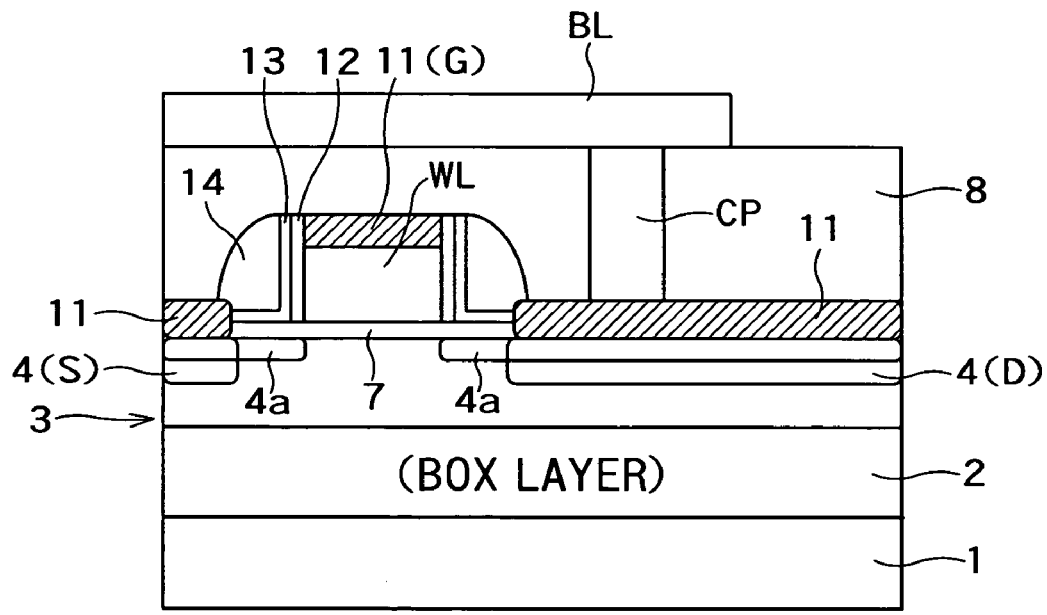
FIG. 10 is a sectional view of a cell periphery portion of the semiconductor device according to the fifth embodiment of the present invention.
Figure 11:
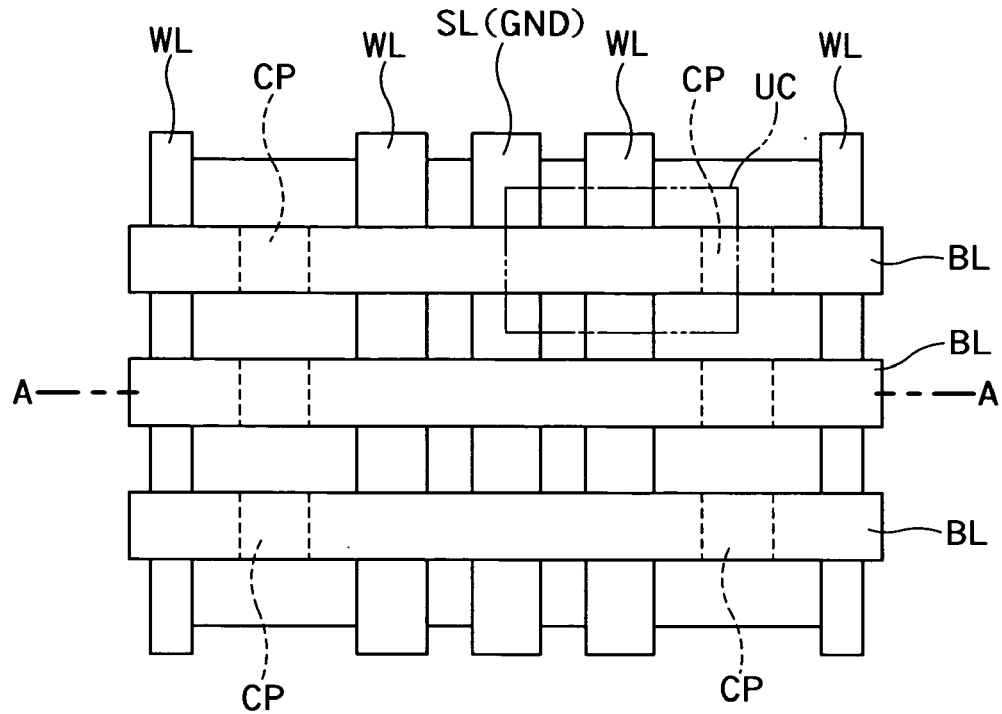
FIG. 11 is a plan view of an example of a semiconductor device known to the present inventor.
Figure 12:
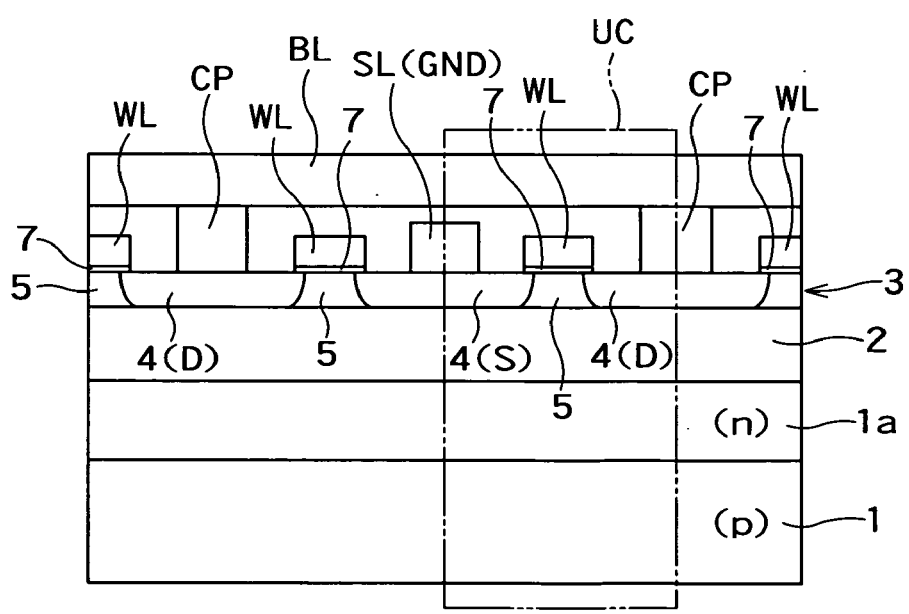
FIG. 12 is a sectional view taken along line A—A of FIG. 11.

FIGS. 9 and 10 are sectional views showing a semiconductor device according to the fifth embodiment of the present invention. FIG. 9 is a sectional view of an FBC memory cell portion, and FIG. 10 is a sectional view of an FBC memory periphery circuit portion. FIGS. 9 and 10 showing the fifth embodiment correspond to FIGS. 1 and 2 showing the first embodiment.

In this embodiment, in the FBC memory cell portion, the upper portion of the gate is not a self-aligned silicide. Accordingly, this embodiment has a self-aligned contact. However, in the periphery circuit portion, the upper portion of the gate is changed to a self-aligned silicide, which makes the manufacture process complicated. The difference between the third and fifth embodiments lies in that in the fifth embodiment, the upper portion of the gate (WL) of a transistor in the periphery portion is a self-aligned silicide portion 11, while in the third embodiment shown in FIG. 6, the upper portion of the gate (WL) of a transistor is not formed of a self-aligned silicide.

With the aforementioned structure, the bit line BL and the source line SL are adjusted to have a lower resistance. In this case, the surfaces of the diffusion layer regions 4 are not changed to a self-aligned silicide. Accordingly, it is possible to prevent the occurrences of interface reactions and crystal defects at the junction portions, thereby preventing the increase in junction leakage current.

As described above, according to the semiconductor device of the fifth embodiment, it is possible to form lower resistance wiring and a stable charge-storage portion, thereby improving the performance of the semiconductor memory. In this embodiment, the upper portion of the gate in the FBC memory cell portion does not have a self-aligned silicide structure but has a self-aligned contact structure, while the upper portion of the gate in the periphery portion has a self-aligned silicide structure, as can be understood from FIG. 10. Accordingly, the manufacture process in the periphery portion becomes complicated. However, at present, FBC memories are applied to mixture-type integrated circuits. Accordingly, it is possible to use conventional devices as DRAM transistors and periphery transistors. Therefore, this embodiment has an advantageous effect that alignment is facilitated.

As described above, according to the embodiment of the semiconductor device of the present invention, in a transistor having a channel region serving as a charge-storage region, the resistance of the wiring relating to the source and drain regions is decreased. Accordingly, hot holes in the charge-storage region are increased and the junction leakage current at the junction portions is prevented, thereby improving the charge holding ability.

What is claimed is:

1. A semiconductor device comprising:
   a cell transistor including:
   a pair of source and drain regions formed in a surface portion of a silicon substrate so as to have a predetermined space therebetween;
   a channel region sandwiched by the source and drain regions;
   a gate formed above the channel region with a gate dielectric film being formed therebetween; and
   silicon plugs formed on the silicon substrate, the silicon plugs electrically contacting the source and drain regions, an upper portion of the silicon plugs being a first self-aligned silicide portion.

2. The semiconductor device according to claim 1, comprising a memory cell portion including a plurality of first transistors and a periphery circuit portion including at least one second transistor for activating the memory cells, wherein each of the first transistors corresponds to the cell transistor.

3. The semiconductor device according to claim 2, wherein surface portions of the silicon substrate serving as surface portions of the source and drain regions of the second transistor in the periphery circuit portion serve as second self-aligned silicide portions, and a height of the second self-aligned silicide portions is different from a height of the first self-aligned silicide portion.

4. The semiconductor device according to claim 1, wherein a wiring line is connected to a predetermined first self-aligned silicide portion.

5. The semiconductor device according to claim 2, wherein an upper portion of a gate of at least one of the first transistor and the second transistor is changed to a self-aligned silicide.

6. The semiconductor device according to claim 5, wherein the upper portion of the gate of the first transistor is not changed to a self-aligned silicide, and the upper portion of the gate of the second transistor is changed to a self-aligned silicide.

7. The semiconductor device according to claim 2, wherein neither an upper portion of the first transistor nor an upper portion of the second transistor is changed to a self-aligned silicide.

8. The semiconductor device according to claim 1, wherein the silicon substrate is an SOI substrate.

9. The semiconductor device according to claim 8, comprising a memory cell portion including a plurality of first transistors and a periphery circuit portion including at least one second transistor for activating the memory cells, wherein each of the first transistors corresponds to the cell transistor.

10. The semiconductor device according to claim 9, wherein surface portions of the silicon substrate serving as surface portions of the source and drain regions of the second transistor in the periphery circuit portion serve as second self-aligned silicide portions, and a height of the second self-aligned silicide portions is different from a height of the first self-aligned silicide portion.

11. The semiconductor device according to claim 8, wherein a wiring line is connected to a predetermined first self-aligned silicide portion.

12. The semiconductor device according to claim 8, wherein an upper portion of a gate of at least one of the first transistor and the second transistor is changed to a self-aligned silicide.

13. The semiconductor device according to claim 12, wherein the upper portion of the gate of the first transistor is not changed to a self-aligned silicide, and the upper portion of the gate of the second transistor is changed to a self-aligned silicide.

14. The semiconductor device according to claim 1, wherein the silicon substrate is a bulk silicon substrate.

15. The semiconductor device according to claim 14, comprising a memory cell portion including a plurality of first transistors and a periphery circuit portion including at least one second transistor for activating the memory cells, wherein each of the first transistors corresponds to the cell transistor.

16. The semiconductor device according to claim 15, wherein surface portions of the silicon substrate serving as surface portions of the source and drain regions of the second transistor in the periphery circuit portion serve as second self-aligned silicide portions, and a height of the second self-aligned silicide portions is different from a height of the first self-aligned silicide portion.

17. The semiconductor device according to claim 14, wherein a wiring line is connected to a predetermined first self-aligned silicide portion.

18. The semiconductor device according to claim 14, wherein an upper portion of a gate of at least one of the first transistor and the second transistor is changed to a self-aligned silicide.

19. The semiconductor device according to claim 18, wherein the upper portion of the gate of the first transistor is not changed to a self-aligned silicide, and the upper portion of the gate of the second transistor is changed to a self-aligned silicide.

* * * * *